United States Patent
Balaji

(10) Patent No.: US 9,718,707 B2
(45) Date of Patent: Aug. 1, 2017

(54) WATER PURIFICATION DEVICE

(71) Applicant: Yash Balaji, Pennington, NJ (US)

(72) Inventor: Yash Balaji, Pennington, NJ (US)

(*) Notice: Subject to any disclaimer, the term of this patent is extended or adjusted under 35 U.S.C. 154(b) by 0 days.

(21) Appl. No.: 15/086,975

(22) Filed: Mar. 31, 2016

(65) Prior Publication Data

US 2016/0289089 A1 Oct. 6, 2016

Related U.S. Application Data

(60) Provisional application No. 62/140,888, filed on Mar. 31, 2015.

(51) Int. Cl.
| | |
|---|---|
| *A61L 2/08* | (2006.01) |
| *C02F 1/32* | (2006.01) |
| *H01L 35/28* | (2006.01) |
| *B65D 1/02* | (2006.01) |
| *B65D 23/08* | (2006.01) |

(52) U.S. Cl.
CPC ............ *C02F 1/325* (2013.01); *B65D 1/0223* (2013.01); *B65D 23/0842* (2013.01); *H01L 35/28* (2013.01); *C02F 2201/3227* (2013.01); *C02F 2303/04* (2013.01); *C02F 2307/02* (2013.01)

(58) Field of Classification Search
USPC ... 250/453.11, 454.11, 455.11, 492.1, 493.1, 250/494.1, 504 R, 504 H
See application file for complete search history.

(56) References Cited

U.S. PATENT DOCUMENTS

| | | | | |
|---|---|---|---|---|
| 6,074,565 | A * | 6/2000 | Buckner | A23L 2/50 210/748.03 |
| 8,906,203 | B2 * | 12/2014 | Ugolin | B01D 1/16 203/10 |
| 2008/0251125 | A1 * | 10/2008 | Cheng | F24F 5/0042 136/259 |

FOREIGN PATENT DOCUMENTS

CN         104257211 A  * 10/2014  .............. C02F 1/28

* cited by examiner

*Primary Examiner* — Nicole Ippolito
(74) *Attorney, Agent, or Firm* — Dunlap Bennett & Ludwig PLLC

(57) ABSTRACT

A water purifier is provided. The water purifier includes a material having an inner surface and an outer surface. At least one thermoelectric generator tile is attached to the material. The at least one thermoelectric generator tile includes a cool side facing towards the inner surface and a heat side facing away from the inner surface. At least one Ultraviolet (UV) C light source is electrically connected to the at least one thermoelectric generator tile. Water may cool the cool side of the thermoelectric generator tile while body heat may warm the heat side of the thermoelectric generator tile, thereby generating electricity which in turn powers the UV C light source. The UV C light source emits UV C light which kills microorganisms within the water.

10 Claims, 4 Drawing Sheets

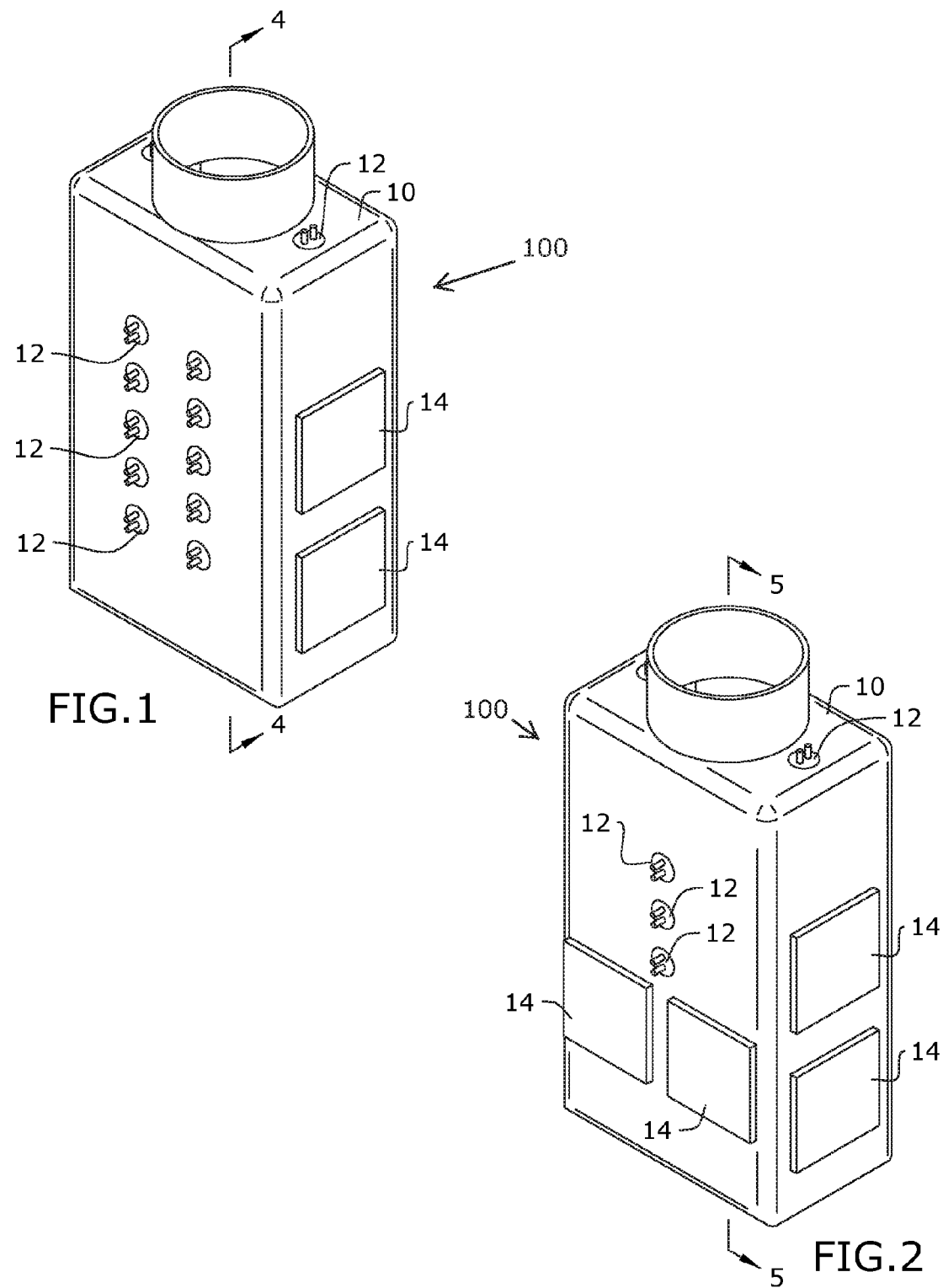

WATER PURIFICATION DEVICE

CROSS-REFERENCE TO RELATED APPLICATION

This application claims the benefit of priority of U.S. provisional application No. 62/140,888, filed Mar. 31, 2015, the contents of which are herein incorporated by reference.

BACKGROUND OF THE INVENTION

The present invention relates to water purification and, more particularly, to water purification using a renewable energy.

Water purification is the process of removing undesirable chemicals, biological contaminants, suspended solids and gases from contaminated water. Power from the electrical grid, a battery, a fuel cell, solar panels, or filters are currently required to purify water. In countries that lack access to filters and power, water purification is a serious concern.

As can be seen, there is a need for a water purifier that does not require the use of filters or outside power sources.

SUMMARY OF THE INVENTION

In one aspect of the present invention, a water purifier comprises: a material comprising an inner surface and an outer surface; at least one thermoelectric generator tile attached to the material, the at least one thermoelectric generator tile comprising a cool side facing towards the inner surface and a heat side facing away from the inner surface; and at least one Ultraviolet C light electrically connected to the at least one thermoelectric generator tile.

These and other features, aspects and advantages of the present invention will become better understood with reference to the following drawings, description and claims.

BRIEF DESCRIPTION OF THE DRAWINGS

FIG. 1 is a front perspective view of an embodiment of the present invention;

FIG. 2 is a rear perspective view of an embodiment of the present invention;

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Figure 3:
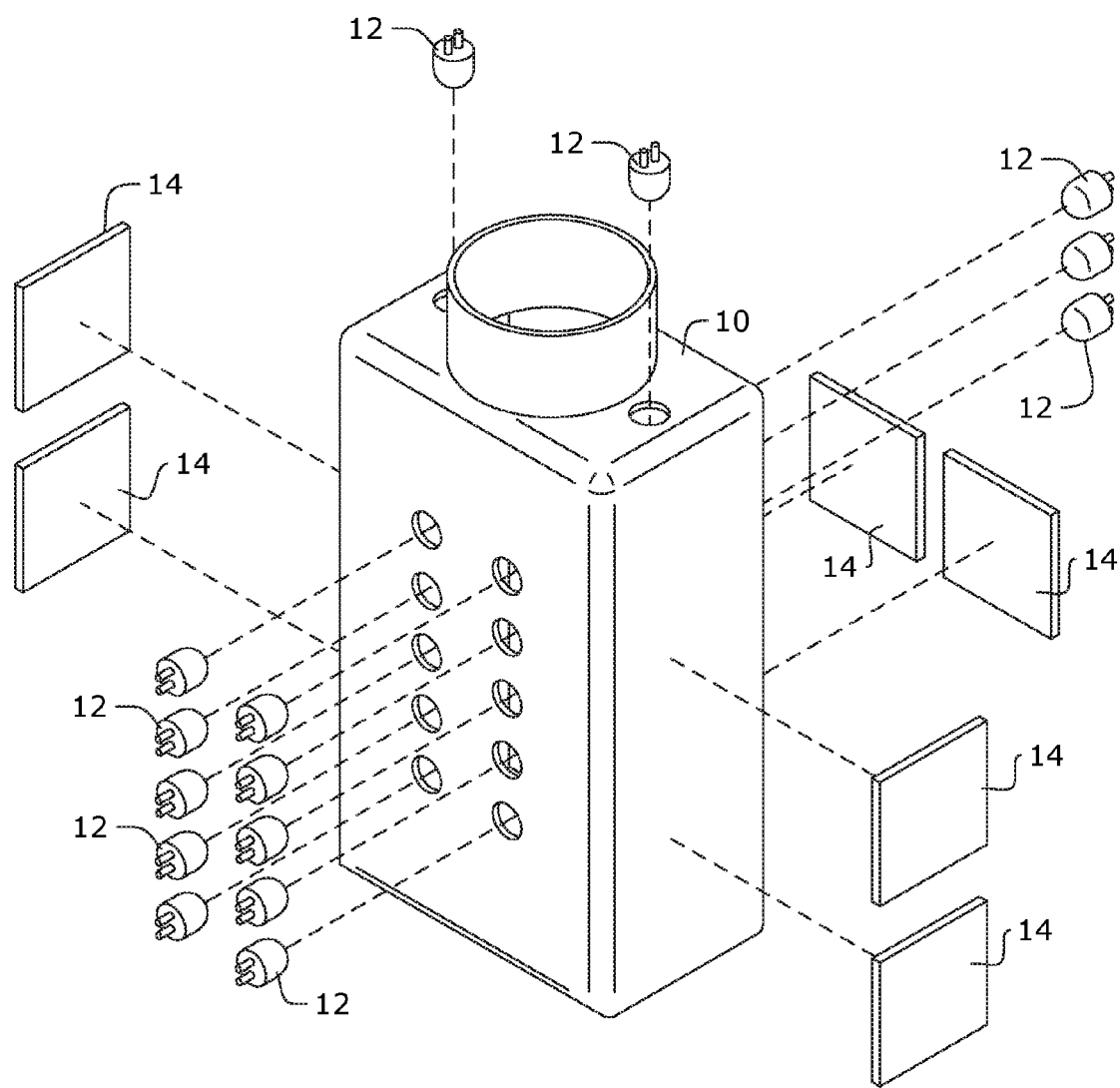
FIG. 3 is an exploded view of an embodiment of the present invention.
Figure 4:
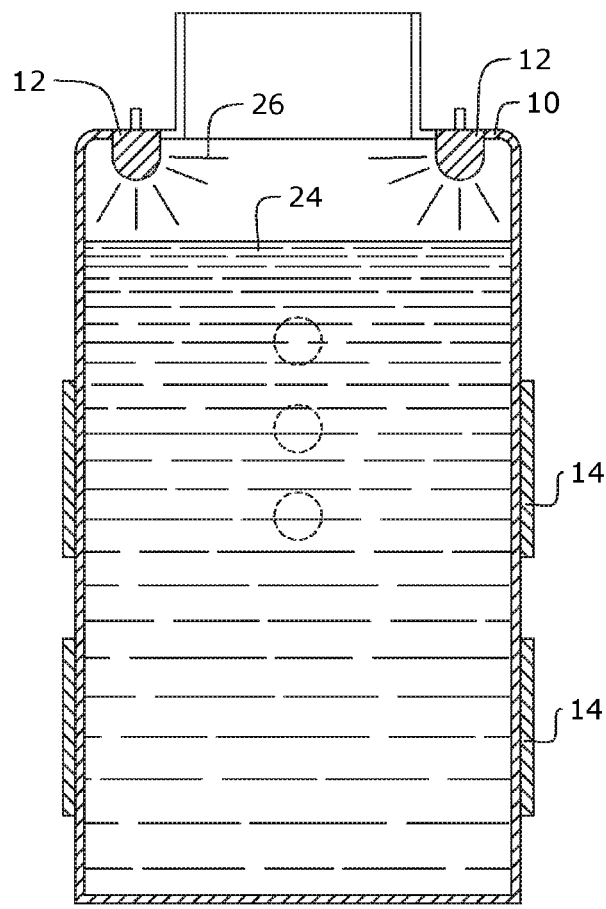
FIG. 4 is a section view of the present invention taken along line 4-4 in FIG. 1.
Figure 5:
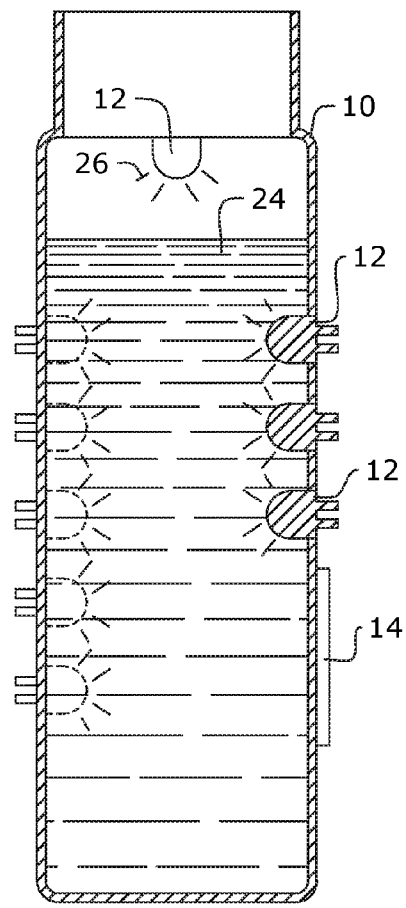
FIG. 5 is a section view of the present invention taken along line 5-5 in FIG. 2.
Figure 6:
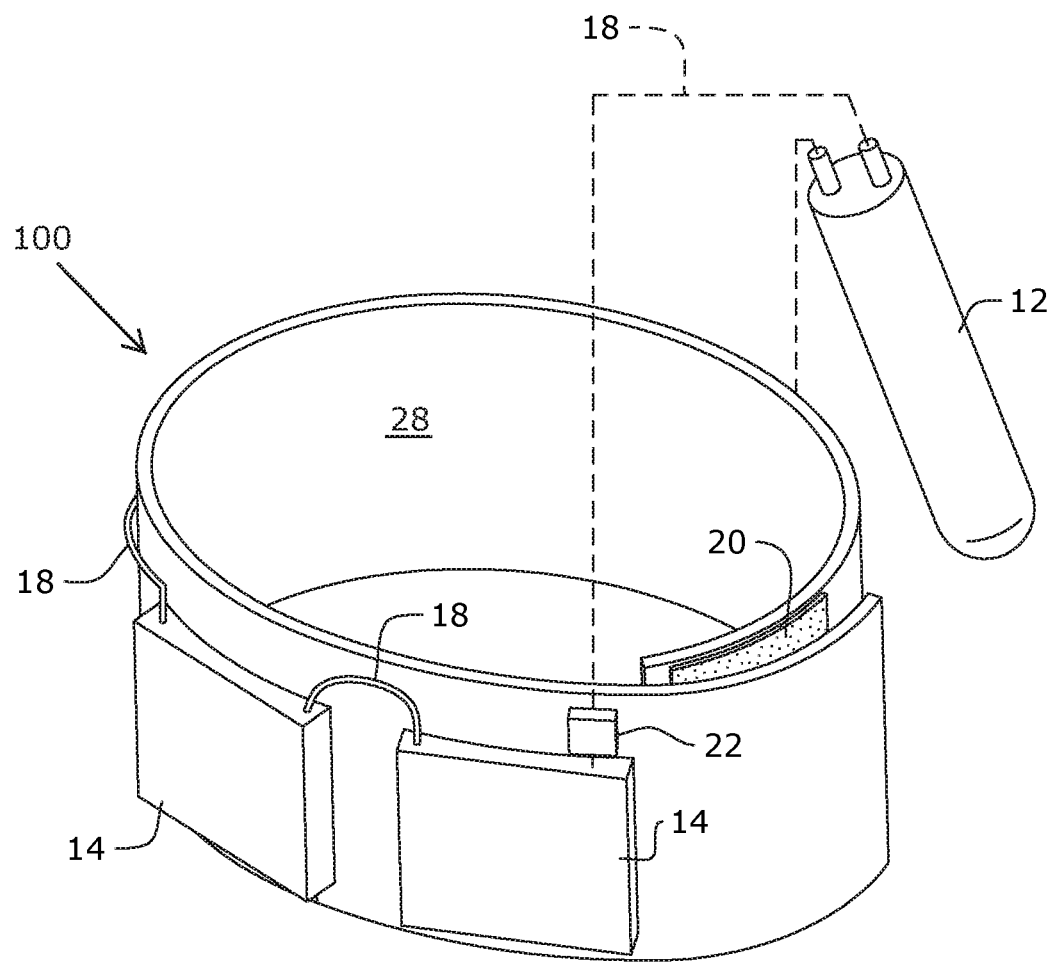
FIG. 6 is a perspective view of an embodiment of the present invention.

Referring to FIGS. 1 through 6, the present invention includes a material 100 having an inner surface and an outer surface. At least one thermoelectric generator tile 14 is attached to the material. The at least one thermoelectric generator tile 14 includes a cool side facing towards the inner surface and a heat side facing away from the inner surface. At least one Ultraviolet (UV) C light source 12 is electrically connected to the at least one thermoelectric generator tile 14. Water may cool the cool side of the thermoelectric generator tile 14 while body heat may warm the heat side of the thermoelectric generator tile 14, thereby generating electricity which in turn powers the UV C light source 12. The UV C light source 12 emits UV C light 26 which kills microorganisms within the water.

The material 100 of the present invention may include a water bottle 10. The water bottle 10 may include a front face, a rear face, a first side face, a second side face, a bottom, and a top. An opening is formed at the top. The water bottle 10 may include a plurality of openings formed therethrough. Each opening may secure a UV C light source 12 within. The UV C light source 12 may be a UV C emitting diode (LED). The UV light sources 12 may be faced inward towards the inside of the water bottle 10. The thermoelectric generator tiles 14 may be attached to an outer surface of the water bottle 10 and may be electrically connected to the UV C light sources 12. When a user holds a water bottle 10, energy may be generated by the thermoelectric generator tiles 18 and transferred to the UV C light sources 12. The UV C light sources 12 are turned on and the UV light 26 kills microorganisms within the water.

The holes may be made in three faces of the bottle/container, the front and rear face, and the top. The UV C light sources 12 may be placed in the holes. The thermoelectric generator tile 14 may be attached to three of the bottle's faces. A thin layer of silver-based thermal compound may be applied between the thermoelectric generator tile 14 and water bottle 10 prior to the application of the glue. The cool sides of the thermoelectric generator tile 14 face the water bottle 10 and the heat sides of the thermoelectric generator tile 14 face away from the water bottle 10. Each of the thermoelectric generator tile 14 and the UV C light source 12 may be connected in series with wires and alligator clips. Epoxy putty may be placed atop the UV C light sources 12 to seal the holes, and epoxy putty may also be used to protect the sides of thermoelectric generator tile 14 from moisture. A glue may hold the thermoelectric generator tiles 14 to the water bottle 10. The thermal compound provides better heat transfer.

In certain embodiments, the water bottle 10 may be rectangular prism shape with 90 degree rounded edges that are about 0.5 cm wide, creating faces that are surrounded by a chamfered border. The side facing the user, the front face, may include the vertical long edges of the base and top. The front face may include ten holes in it arranged in two columns of five. Each column may be about 3 cm from the nearest vertical edge of the faces and there may be about 2 cm between the centers of each hole. The center of the topmost holes may be about 4.3 cm from the top edge of the front face.

The first side face may include vertical edges and the short edges of the base and top. About 2.5 cm above the bottom edge of the first side face may be the bottom edge of the first thermoelectric generator tile 14. Measuring about 4 cm on each side, the thermoelectric generator tile 14 may be centered and affixed to the first side face with super glue along the edges of the thermoelectric generator tile 14. About 0.6 cm above the first thermoelectric generator tile 14 is a second thermoelectric generator tile 14. The second thermoelectric generator tile 14 has the same dimensions and is affixed and arranged the same way as the first thermoelectric generator tile 14. Along the edges of and between the thermoelectric generator tiles 14 may be waterproof epoxy putty.

Opposite of the front face is the rear face. The rear face may include two thermoelectric generator tiles 14. The top edges of the thermoelectric generator tiles 14 may be about 8.8 cm from the top edge of rear face. They are affixed in the same manner as the other tiles and have a similar layer of thermal compound. Their edges are, similarly to the other tiles, covered by waterproof epoxy putty. About 2 cm above the thermoelectric generator tiles 14 is the center of a hole, the bottom hole of a centered column of 3 holes with 3 cm between the centers of each hole. About 0.8 cm above the top of the topmost hole is the top edge of the rear face.

In certain embodiments, the top of the water bottle 10 may include two additional holes. Each hole in the bottle is about 1.0 cm in diameter and has about a 1 cm diameter UV C light source 12 plugged inside. The UV C light source 12 produces light of wavelength 400 nm. Each UV C light source 12 may be held in place by waterproof epoxy putty. The putty covers the rear of the UV C light source 12, sealing the hole and preventing the UV C light source 12 from moving due to the wider rear face of the UV C light source 12. The thermoelectric generator tile 14 may be connected in series with wires and alligator clips, which are then connected to the UV C light source 12 in series with wires and alligator clips. The present invention uses the heat differential between the water 24 inside the bottle and the hands of the user in order to generate electricity using the thermoelectric generator tile 14. This electricity is used to power the UV C light source 12 which, facing inwards, kill microorganisms in the water 24.

The material 100 of the present invention may include a sleeve 28. The sleeve 28 may be made of an elongated material having a rubber elasticity. The sleeve 28 may include a first end and a second end. The first end and the second end may be secured together by a connector 20. The connector 20 may be a hook and loop fastener, clips, snap buttons, ties, and the like. The thermoelectric generator tiles 14 may be secured to the sleeve 28 such that the cool side is facing towards the inner surface of the sleeve 28 and the heat side is facing away from the inner surface of the sleeve 28. The thermoelectric generator tiles 14 may be electrically connected to a large UV C light source 12. The sleeve 28 may be wrapped around a container of water 24 and the UV C light source 12 may be positioned to emit UV C light 26 towards the water 24. Water 24 may cool the cool side of the thermoelectric generator tile 14 while body heat may warm the heat side of the thermoelectric generator tile 14, thereby generating electricity which in turn powers the UV C light source 12. The UV C light source 12 emits UV C light 26 which kills microorganisms within the water 24.

In certain embodiments, a hook and loop fastener may be attached to each end of the elastic sleeve 28 on opposite sides using adhesive. The thermoelectric generator tiles 14 are affixed to the elastic sleeve using adhesive, with the heat side facing outwards. The thermoelectric generator tiles 14 are wired together to make one power source. The thermoelectric generator tiles 14 can be wired in either series or parallel. The negative lead of the connected tile system is then hooked up to the step-up DC-DC regulator 22. The regulator 22 is connected to the positive terminal of the UV C light source 12 using wire 18. The negative terminal of the light source is then connected back to the tile system power source using wire 18 so that the circuit is complete. A transparent water proof covering may be affixed to the UV C light source 12 so that the light source does not get wet but the light is not obstructed.

The elastic sleeve 28 wraps around the user's water container. The sleeve 28 holds the thermoelectric generator tiles 14 so that the user's hands, when they hold the bottle, contact the surface of the thermoelectric generator tiles 14. The connector 20 allows the elastic sleeve 28 to be secured to the user's water container so that it doesn't fall off. The thermoelectric generator tiles 14 generate an electric current from the temperature differential between the user's hands, which are hot, and the water container's surface, which is cooler. All of the thermoelectric generator tiles 14 wired together to create one power source, which is routed to the step-up DC-DC regulator 22. The regulator 22 converts the input voltage to a regulated output voltage that will work with the UV C light source 12. The UV C light source 12 receives the regulated power of the thermoelectric generator tiles 14 through the wire 18 connecting it to the regulator 22. The UV C light source 12 is connected back to the thermoelectric generator tiles 14 through a wire 18, completing the circuit and powering the light source 12. The waterproof transparent covering protects the UV-C light source 12 from water 24 so that it can be placed in/near the water 24 in the container. The UV-C light 26 from the light source 12 kills microorganisms in the water 24 that is in the container.

In alternate embodiments, the present invention may include an indicator of some variety to let the user know when the water 24 is purified. The present invention may also include a reusable particle filter stored in the elastic sleeve 28 that could be placed over the entrance of the water container in order to remove any particles from the water 24. The particle filter is cleaned by pouring purified water 24 from the container through it.

It should be understood, of course, that the foregoing relates to exemplary embodiments of the invention and that modifications may be made without departing from the spirit and scope of the invention as set forth in the following claims.

What is claimed is:

1. A water purifier comprising:
   a material comprising an inner surface and an outer surface;
   at least one thermoelectric generator tile attached to the material, the at least one thermoelectric generator tile comprising a cool side facing towards the inner surface and a heat side facing away from the inner surface; and
   at least one Ultraviolet C light source electrically connected to the at least one thermoelectric generator tile.

2. The water purifier of claim 1, wherein the material is a water bottle.

3. The water purifier of claim 2, wherein the water bottle comprises a front face, a rear face, a first side face, a second side face, a bottom, and a top, wherein an opening is formed at the top.

4. The water purifier of claim 3, wherein the at least one Ultraviolet C light source is a plurality of Ultraviolet C light sources secured to the water bottle and positioned to emit Ultraviolet light towards an inside of the water bottle.

5. The water purifier of claim 4, wherein at least the front face, the rear face and the top comprise at least one of the plurality of Ultraviolet C light sources.

6. The water purifier of claim 3, wherein the at least one thermoelectric generator tile is a plurality of thermoelectric generator tiles secured to the water bottle.

7. The water purifier of claim 6, wherein at least the first side face and the second side face comprise at least one of the plurality of thermoelectric generator tiles.

8. The water purifier of claim 1, wherein the material is a sleeve sized to fit around a water bottle.

9. The water purifier of claim 8, wherein the sleeve comprises a first end and a second end releasably attached by a connector.

10. The water purifier of claim 1, further comprising a DC-DC regulator electrically connecting the at least one thermoelectric generator tile to the at least one Ultraviolet C light source.

\* \* \* \* \*